United States Patent [19]

Tanaka et al.

[11] Patent Number: 5,425,491
[45] Date of Patent: Jun. 20, 1995

[54] BONDING TOOL, PRODUCTION AND HANDLING THEREOF

[75] Inventors: Katsuyuki Tanaka; Hideaki Morigami, both of Itami, Japan

[73] Assignee: Sumitomo Electric Industries, Ltd., Osaka, Japan

[21] Appl. No.: 319,011

[22] Filed: Oct. 6, 1994

Related U.S. Application Data

[62] Division of Ser. No. 82,838, Jun. 28, 1993, Pat. No. 5,373,731.

[30] Foreign Application Priority Data

Jul. 1, 1992 [JP] Japan .................. 4-197837

[51] Int. Cl.⁶ .................... H01L 21/603; B24B 1/00
[52] U.S. Cl. ................. 228/44.7; 228/180.21; 451/53; 451/55
[58] Field of Search ............. 228/44.7, 6.2, 180.21, 228/180.22; 451/53, 55

[56] References Cited

U.S. PATENT DOCUMENTS

| | | | |
|---|---|---|---|
| 2,460,312 | 2/1949 | Scherer | 451/53 |
| 5,197,651 | 3/1993 | Nakamura et al. | 228/44.7 |
| 5,213,248 | 5/1993 | Horton et al. | 228/44.7 |

FOREIGN PATENT DOCUMENTS

| | | |
|---|---|---|
| 198360 | 8/1991 | Japan . |
| 209702 | 8/1942 | Switzerland . |
| 626090 | 7/1949 | United Kingdom . |

Primary Examiner—Kenneth J. Ramsey
Attorney, Agent, or Firm—Wenderoth, Lind & Ponack

[57] ABSTRACT

A bonding tool capable of uniformly pressing all electrodes of a semiconductor element and surely bonding all the electrodes and leads, even if the end pressing surface of a tool end part of a bonding tool is enlarged with the large-sized and long-sized tendency of semiconductor elements, is provided in which an end pressing surface of a tool end part fitted to a shank is composed of a hard material, characterized in that the end pressing surface is gradually curved to form a concave surface from the peripheral part to the central part at an application temperature of the bonding tool and the degree of flatness of the concave end pressing surface is in the range of 1 to 5 μm at the application temperature of the bonding tool.

6 Claims, 7 Drawing Sheets

BONDING TOOL, PRODUCTION AND HANDLING THEREOF

This is a divisional application of Ser. No. 08/082,838, filed Jun. 28, 1993, now U.S. Pat. No. 5,373,731.

BACKGROUND OF THE INVENTION

1. Field of the Invention

This invention relates to a bonding tool used, in particular, as a compression bonding tool for wireless bonding of a TAB system (Tape Automated Bonding), etc. in mounting semiconductor elements of IC and LSI, etc. on substrates, etc., or in bonding semiconductor elements of IC, etc. to electrode wires, a process for the production of the same and a method of measuring the flatness of a bonding tool at an application temperature.

2. Description of the Prior Art

Lately, technical progress in the field of semiconductors has become remarkable and production of the appliances using IC or LSI has shown a yearly increase. In order to draw out the electrical properties of these semiconductors, it is required to bond an electrode formed on an IC with a metal-plated lead or a metallic fine wire called a bonding wire. As the metal to be bonded, there is ordinarily used Au or an Au-Sn alloy which is chemically stable and has high electric conductivity, and a bonding method comprising thermocompression a bonding by means of bonding tool heated has widely been used.

The large-size and high density tendency of IC chips with the increase of functionality of IC results in a requirement that a bonding tool should be large-sized and the tool end surface should be so flat as to be represented by a degree of flatness of at most 1 $\mu$m at an application temperature in order to uniformly press electrodes and leads formed around an IC with high precision.

In the bonding tools produced by the process of the prior art, if the end surface dimension exceeds 10 mm square, an excellent degree of flatness of at most 1 $\mu$m can be obtained at normal temperature, but when the bonding tool is heated to a real application temperature selected from a range of 200° to 650° C., a warp occurs at the end surface of the tool due to a difference in coefficient of thermal expansion between a material such as diamond used for the end part of the tool and a metallic material used for a shank so that no flat surface is obtained. In mounting the IC, therefore, compression by the bonding tool is partly ununiform to cause a poor connection referred to as "open".

In order to mount a semiconductor element in a form of capable of practically use and to draw the electrical properties thereof, it is required to electrically connect an electrode formed on the semiconductor element with a lead of a package and electrically connect this lead with an external terminal of a printed wiring plate.

Connection of an electrode of a semiconductor element with a lead of package has been carried out by a wire-bonding method comprising connecting lead wires (bonding wires) of metallic fine wires consisting of gold or copper, one by one, by the use of a tool called a capillary. Of late, furthermore, wireless bonding of a TAB system, etc. has been widely used and comprising using a lead called a film carrier tape composed of a pattern-formed copper foil plated with gold or tin, and collectively connecting patterned leads on the film and electrodes of a semoconductor element by the use of a bonding tool heated at a predetermined temperature.

The bonding tool of the prior art, used in wireless bonding, etc. of a TAB system, etc. consists of a metallic single substance such as Mo, Fe—Ni alloys, Ni alloys, Ti or Ti alloys, W or W—Ni alloys, W—Cu alloys, Fe—Ni—Co alloys, cemented carbides and the like and has generally been used while heating at a predetermined temperature by directly passing electric current or inserting a heater. However, the bonding tool consisting of such a metallic single substance has the disadvantages that the flatness of the end pressing surface is not good, the temperature distribution is not uniform and the wear resistance is too inferior to maintain the service life of the tool.

In order to obviate the disadvantages of the bonding tool consisting of the metallic single substance, there have lately been used, in many cases, bonding tools each having the end pressing surface composed of a hard material such as polycrystalline diamond, single crystal diamond, sintered polycrystalline diamond, sintered polycrystalline cubic boron nitride (cBN), etc. For example, polycrystalline diamond is formed on a base plate consisting of a sintered compact of $Si_3N_4$, SiC or AlN, as a predominant component, or Si by a low pressure gaseous phase synthesis method and bonded with a shank of the bonding tool. Another hard material is often fitted to the shank as it is.

Lately semiconductor chips have tended to be large-sized or long due to multifunctional high integration and realization of a semiconductor chip with 20 mm sqaure or more is supposed. With the this recent tendency of semiconductor chips the end pressing surface of the above described hard material is necessarily enlarged in the bonding tool. Further with this tendency of the semiconductor and bonding tool as described above, it has increasingly been difficult to bond all electrodes on a semiconductor chip and all leads on a film tape carrier with high reliance.

That is, for bonding all electrodes on a semiconductor chip and all leads on a film tape carrier with high reliance, it is necessary to uniformly press all the leads on all the electrodes by means of a bonding tool and to this end, a relative gap allowable between the leads superimposed on the electrodes and the end part of the bonding tool should be at most 3 $\mu$m, ideally at most 1 $\mu$m. When the end pressing surface is completely flat, for example, dispersion of (or differences in) the heights of the electrodes and leads, in summation, is generally allowed by upto 3 $\mu$m and, conversely when there is no dispersion in the sum of the heights of the electrodes and leads, the degree of flatness of the end pressing surface can be up to 3 $\mu$m. If the dispersion or the degree of flatness exceeds 3 $\mu$m, uniform pressing of the end pressing surface is impossible and results in localized peeling or lowering of the bonding strength between the electrodes and leads.

Thus, based on the recognition that there is little dispersion in the heights of the electrodes on the semiconductor chip and the leads on the film in the production thereof, only improvement of the degree of flatness of the end pressing surface in the bonding tool is expected and continued under the size-increasing tendency of the end pressing surface. Specifically, it has been considered that in order to uniformly press all of an electrode 2 and lead 3 on a semiconductor chip 1, provided in such a manner that there is no dispersion in heights as shown in FIG. 4 and they are stacked to be substantially flat, the degree of flatness of an end pressing surface 6 in a tool end part 5 provided at the end of a bonding tool 4 should be at most about 1 μm. That is, the end pressing surface 6 in the tool end part 5 formed of a hard material mainly consisting of diamond or cBN should have a central part formed in a somewhat outward or curved convex manner and this end pressing surface 6 in the convex form should have a degree of flatness in the range of at most about 1 μm (i.e. a 1 μm difference in height between the central part and peripheral part). Various efforts have been made to this end.

In order to obtain a bonding tool having such a good flatness, there has been employed a method comprising polishing the end pressing surface of a tool end part at normal temperature, for example, by lapping, etc. up to the present time, and it has been possible to finish the end pressing surface with a degree of flatness of at most 1 μm, measured at normal temperature. The measurement of the degree of flatness of the end pressing surface in the bonding tool is carried out by the use of a contact type flatness measurement apparatus in which a mechanical displacement of a contact needle is converted into an electric signal and detected, a non-contact type flatness measurement apparatus of in which a displacement of a distance is detected by measurement of a reflected wave using a laser, e.g. He—Ne laser or semi-conductor laser, or a laser interferometer.

Even if the tool end part of a bonding tool is worked so that the dgree of flatness of the end pressing surface at most 1 μm measured at normal temperature by a laser interferometer, however, there have occurred a number of problems due to the large size of the semiconductor chips including, for example, deterioration of bonds between electrodes and leads or other tendencies of electrodes and leads to separate from one another once bonded, when semiconductor chips are really mounted.

As one technique of mounting an IC, there is a system of continuously bonding electrodes formed on the IC with lead wires formed on a film carrier tape using a bonding tool, which is called the "TAB system". In a bonding tool for TAB used in this TAB system, as a tool end part to be provided at the end for pressing, there is ordinarily used gaseous phase-synthesized diamond, single crystal diamond, diamond sintered compact, binderless polycrystalline cBN and polycrystalline diamond film on a substrate of Si, $Si_3N_4$, SiC, AlN, etc., and in order to uniformly bond a number of electrodes formed on the IC and lead wires formed on a film with a sufficient strength, it is required that the surface of the bonding tool for the TAB (i.e. surface of the tool end part) is smooth and flat without undulations and inclinations.

Since the apparatus for measurement of the degree of flatness is based on a base plate with a degree of straightness and flatness and finished with high precision, and an instrument sensitive to temperature, such as optical primary standard, it is required to carry out the measurement in an isothermal chamber always maintained at a constant temperature and to maintain an object to be measured, i.e. bonding tool for TAB at or near room temperature.

On the other hand, mounting of an IC by a bonding tool for TAB is generally carried out while heating the bonding tool for TAB at about 200° to 650° C. Accordingly, it is desired to know the degree of flatness of the bonding tool for TAB at this practical temperature, but the standards of the base plate or optical primary standard get out of order at such a high temperature and precise measurement cannot be carried out.

SUMMARY OF THE INVENTION

It is an object of the present invention to provide a bonding tool capable of uniformly pressing all electrodes of a semiconductor element and surely bonding all the electrodes and leads, even if the end pressing surface of a tool end part of the bonding tool is enlarged with the enlargement and elongation of semiconductor elements.

It is another object of the present invention to provide a process for the production of a bonding tool capable of surely preventing occurrence of a poor connection of electrodes and leads of an IC, etc. by limiting the degree of flatness of the tool end at an application temperature of the bonding tool to at most 1 μm, whereby the above described disadvantges of the prior art can be overcome.

It is a further object of the present invention to provide a method of correctly measuring the degree of flatness of a bonding tool for TAB when heated at a practical temperature, i.e. about 200° to 650° C.

These objects can be attained by providing a bonding tool in which an end pressing surface of a tool end part fitted to a shank is composed of a hard material consisting of diamond or cubic boron nitride as a predominant component, characterized in that the end pressing surface is gradually curved to form a concave surface from the peripheral part to the central part at an application temperature of the bonding tool and the degree of flatness of the concave end pressing surface is in the range of 1 to 5 μm at the application temperature of the bonding tool. A process for the production of a bonding tool in which an end pressing surface of a tool end part fitted to a shank is composed of a hard material consisting of diamond or cubic boron nitride as a predominant component, is characterized by polishing or grinding the end pressing surface while controlling heating at a temperature somewhat lower than an application temperature of the bonding tool. A method of measuring the degree of flatness at an application temperature of a bonding tool is characterized by arranging a plurality of wires of the same diameter consisting of at least one of gold, silver, copper and aluminum to be parallel with each other on a flat substrate, pressing the end pressing surface of the bonding tool heated at the application temperature on the plurality of wires in the vertical direction to the substrate to deform the wires along the end pressing surface, and determining the quantity of displacement in the vertical direction to the substrate at a predetermined site of each of the wires at normal temperature.

BRIEF DESCRIPTION OF THE DRAWINGS

The accompanying drawings are to illustrate the principle and merits of the present invention in detail.

DETAILED DESCRIPTION OF THE INVENTION

The inventors have made various efforts to attain the foregoing objects and consequently, have reached the present invention relating to a bonding tool in which an end pressing surface of a tool end part fitted to a shank is composed of a hard material consisting of diamond or cubic boron nitride as a predominant component, characterized in that the end pressing surface is gradually curved from the peripheral part to form a concave surface to the central part at an application temperature of the bonding tool, and the degree of flatness of the concave end pressing surface is in the range of 1 to 5 $\mu$m at the application temperature of the bonding tool.

As described above, the bonding tool having the concave end pressing surface with a flatness degree of 1 to 5 $\mu$m at an application temperature of the bonding tool can be produced by polishing the end pressing surface while controlling heating at a temperature somewhat lower than an application temperature of the bonding tool.

The bonding tool obtained in this way is subjected to measurement of the degree of flatness of the end pressing surface at an application temperature by arranging a plurality of wires of the same diameter consisting of at least one of gold, silver, copper and aluminum to be parallel with each other on a flat substrate, pressing the end pressing surface of the bonding tool heated at the application temperature on the plurality of wires in the vertical direction to the substrate to deform the wires along the end pressing surface, and determining the quantity of displacement in the vertical direction to the substrate at a predetermined site of each of the wires at normal temperature.

Figure 2:
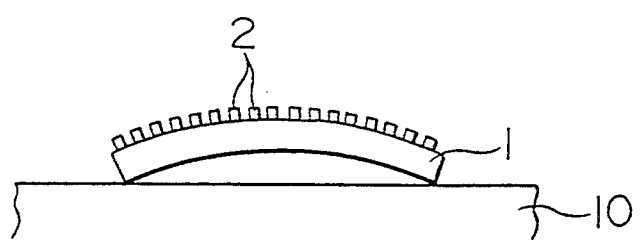
FIG. 2 is a side view of a semiconductor chip warped during mounting.
Figure 3:
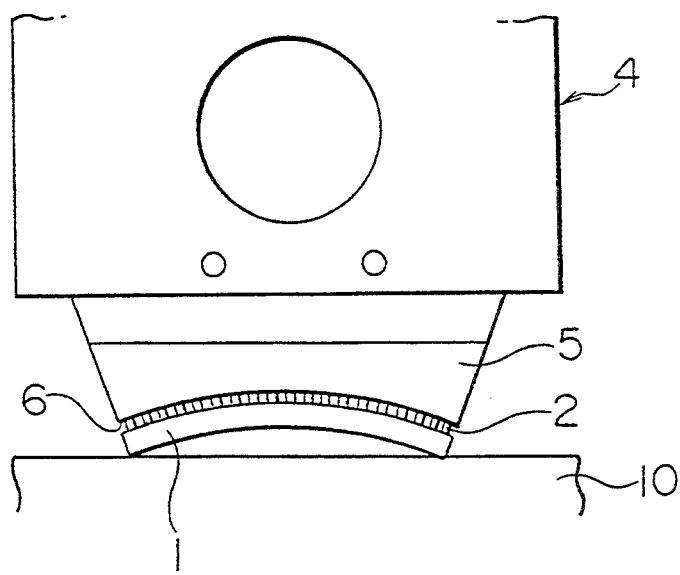
FIG. 3 is a side view illustrating the relationship of the bonding tool of the present invention and a semiconductor chip warped during mounting.

The inventors have made detailed studies on the reason why a good bonding between all electrodes and leads is not obtained even if the end pressing surface of a bonding tool is formed to have a flatness degree of at most 1 $\mu$m and, consequently, have found that this is due to the fact that a semiconductor chip 1 placed on a stage 10 is warped upward or cambered in mounting in such a manner that the central part is higher, as shown in FIG. 2, and the height of the warp, depending on the size of the semiconductor, is at most about 6 $\mu$m.

That is, the stage 10, on which the semiconductor chip 1 is placed, is maintained at room temperature or at a temperature of at most about 200° C., even if heated, so as to prevent the semiconductor chip from thermal damage. On the other hand, the application temperature of the bonding tool is generally several hundreds of °C. and when it is higher, for example, in the case of compression bonding gold-gold, it reaches 600° to 650° C. Accordingly, when the end pressing surface of the bonding tool, heated and maintained at a high temrature, approaches the upper side of the semiconductor chip 1 by several tens of $\mu$m, the circuit-formed surface of the semiconductor chip 1 is heated by radiation to cause a temperature gradient between the circuit-formed surface and lower surface, whereby the semiconductor chip 1 is cambered to lift the central part as shown in FIG. 2, for example, by at most 6 $\mu$m just before or while the semiconductor chip 1 is pressed by the end pressing surface of the bonding tool.

Figure 4:
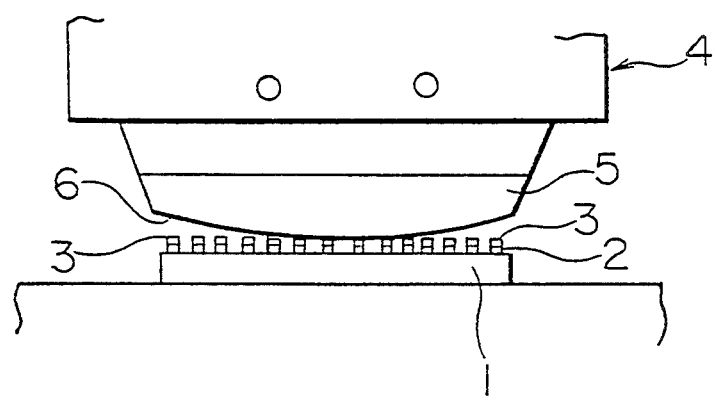
FIG. 4 is a side view illustrating the relationship of the bonding tool considered preferable in the prior art and a semiconductor chip warped during mounting.

In the bonding tool of the prior art, in which the end pressing surface is a completely flat surface or a convex surface whose central part is somewhat higher, as shown in FIG. 4, therefore, it is found that even if the end pressing surface is formed to give a degree of flatness of at most 1 $\mu$m, a semiconductor chip or stage is heated by radiant heat from the bonding tool at a high temperature and warped to give a higher central part when mounting, and a gap tends to be formed between the electrodes of the semiconductor chip and the end pressing surface of the bonding tool, thus resulting in a number of stripping or bonding problems of the electrodes and leads, in particular, when the gap is 3 $\mu$m or more.

Figure 1:
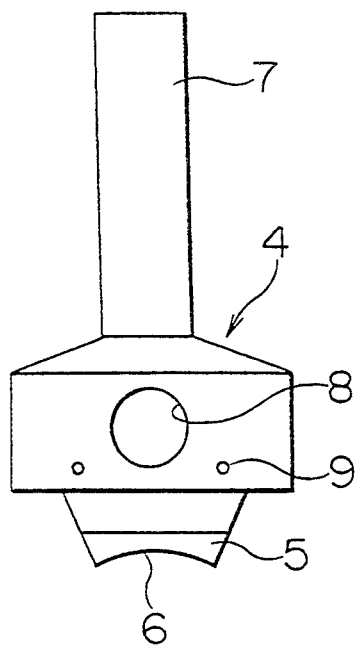
FIG. 1 is a side view of one embodiment of the bonding tool of the present invention.

In the present invention, accordingly, an end pressing surface 6 consisting of a hard material of a bonding tool 4 is formed to be a gradually curved concave surface from the peripheral part to the central part at an application temperature of the bonding tool, as shown in FIG. 1, depending on warp of the semiconductor chip 1 warped in mounting as shown in FIG. 2, and the degree of flatness of the concave end pressing surface 6 is in the range of 1 to 5 $\mu$m at the application temperature of the bonding tool in mounting. Thus, all the electrodes g of the semiconductor chip 1 warped to give a higher central part in mounting can uniformly be compressed by the concave end pressing surface 6 of the bonding tool 4, as shown in Pig. S, whereby the stripping or bonding problems between the electrodes and leads can be reduced.

A method of forming a concave surface with a degree of flatness in the range of 1 to 5 $\mu$m at an application temperature, as described above, on an end pressing surface of a bonding tool will now be illustrated. The end pressing surface of a tool end part according to the present invention is composed of a hard material predominantly consisting of diamond such as polycrystalline diamond, single crystal diamond, diamond compacts, etc. or cubic boron nitride and a shank to be fitted to the tool end is ordinarily composed of molybdenum, tungsten, tungsten-nickel alloys, Kovar, Inconel, Invar alloys, stainless steels, cemented carbides, etc, between which there is a difference in thermal expansion coefficient.

The end pressing surface of the bonding tool heated at the application temperature is warped in such a manner that the peripheral part is projected and the central part becomes depressed by thermal stress due to the difference in thermal expansion coefficient. In the method of the present invention, therefore, the end pressing surface is subjected to polishing working while controlling the warped state of the end pressing surface to be polished by estimating warping of the end pressing surface at the application temperature from the materials of the tool end part and shank and controlling heating of the bonding tool at a temperature somewhat lower than the application temperature so that the end pressing surface is warped to be concave at the application temperature and the degree of flatness of the concave end pressing surface has an optimum value in the range of 1 to 5 $\mu$m.

The heating temperature of a bonding tool during polishing is generally determined so that warping of the end pressing surface during polishing is somewhat smaller than warping at the application temperature, specifically, the heating temperature should be determined depending on the determined application temperature of the bonding tool, the material of a shank and, the size of the end pressing surface. In the case of a bonding tool obtained by bonding a tool end part having an end pressing surface with a long side of at most 20 mm and a long side to short side ratio of at most 2 to a shank of a low thermal expansion alloy such as Kovar or molybdenum with a soft gold brazing agent, for example, it is preferable to heat the bonding tool at a temperature range of 60° to 100° C. lower than the determined application temperature, followed by subjecting it to polishing and working so as to obtain a concave surface with a flatness degree of about 1 $\mu$m.

If the heating temperature of a bonding tool during polishing is too high, warping of an end pressing surface in a concave form is large and its peripheral part is excessively polished and removed, so that the end pressing surface becomes convex or, even if it becomes concave, the flatness degree does not reach 1 $\mu$m. On the contrary, if the heating temperature of the bonding tool is too low, the polishing is carried out under a state in which a concave warping required for the end pressing surface does not occur and the quantity of the peripheral part removed by polishing is too small, so that the end pressing surface is excessively warped in a concave form at the application temperature of the bonding tool and the flatness degree exceeds 5 $\mu$m.

Figure 5:
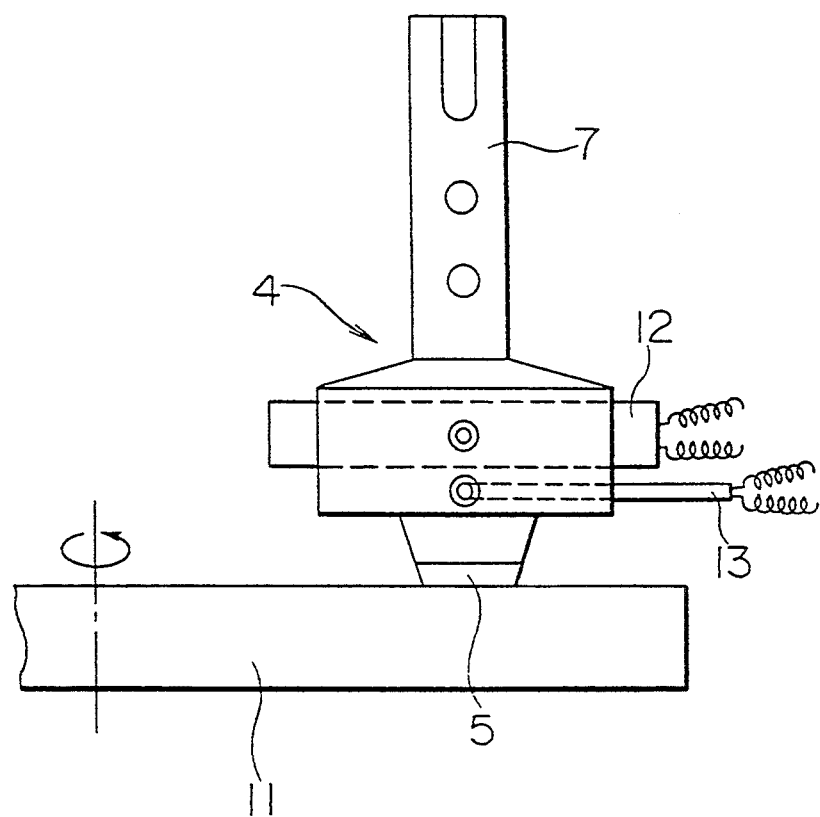
FIG. 5 is a side view schematically illustrating a process for the production of the bonding tool according to the present invention.

A method of polishing an end pressing surface will specifically be illustrated by FIG. 5. 11 designates a polishing machine such as a lapping machine having been used for polishing the end pressing surface of this type up to the present time. A bonding tool 4 is heated at a predetermined temperature by a heater 12 inserted in a heater insertion hole and maintained for about 1 hour until leading to a stationary state while constantly measuring the heating temperature by a thermocouple 13 inserted in a thermocouple insertion hole. Then, the end pressing surface 6 of a tool end part 5 maintained at the predetermined temperature is pressed against the revolving polishing machine 11 at a surface pressure of 0.001 to 1 kg/mm$^2$ and polished for a predetermined time.

Figure 6:
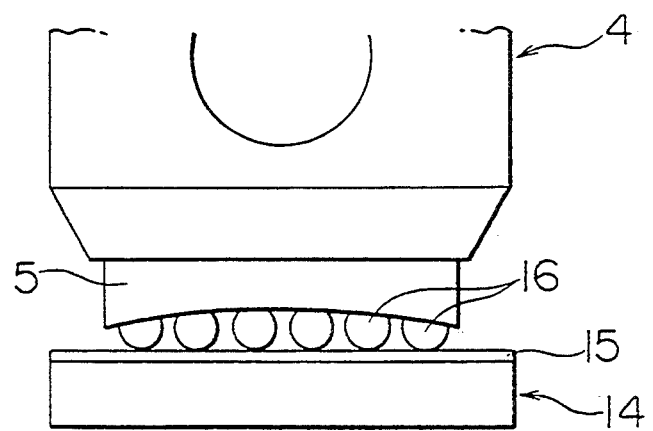
FIG. 6 is a side view schematically showing a state in which an end pressing surface of a bonding tool is pressed to a plurality of wires in a method of measuring the degree of flatness according to the present invention.
Figure 7:
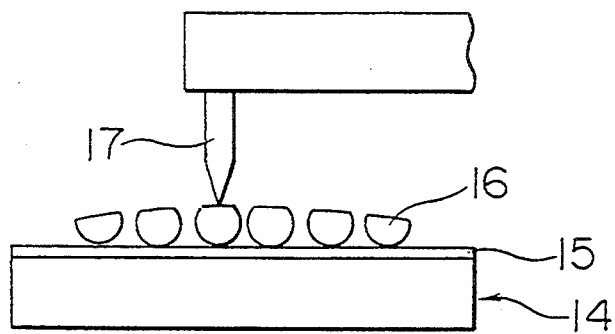
FIG. 7 is a side view schematically showing a state in which the heights of a plurality of wires, deformed by pressing a bonding tool thereto, are determined by needle contacting in a method of measuring the degree of flatness according to the present invention.

The degree of flatness of the end pressing surface obtained by the above described polishing method can be measured by a prior art apparatus such as a laser interferometer. In such a prior art method, however, the measurement error is so large with rising of the temperature, that the degree of flatness of the end pressing surface of the bonding tool 4 can substantially precisely be measured by pressing the end pressing surface of the bonding tool 4 heated at an application temperature against a plurality of wires 16 of a soft metal such as gold put on a substrate 14, and measuring the height of the crushed wires 16, as shown in FIG. 6 and FIG. 7.

According to this measurement method, a plurality of wires 16 for the same diameter and consisting of at least one of gold, silver, copper and aluminum are arranged in parallel with each other, preferably with the same pitch, on a substrate 14 with a flat surface, against which the bonding tool 4 heated at an application temperature of about 200° to 650° C. is pressed from above to deform a plurality of the wires 16. The degree of flatness of the end pressing surface of the bonding tool 4 is thus transferred to a plurality of the wires 16.

The wire 16 used preferably has a diameter of at least 0.01 mm for transferring precisely the degree of flatness, since a diameter of more than 5.0 mm is not economical and a pitch required for the deformation of the wire 16 is wide to lower the measurement precision. This is not preferable. The pitch for arranging the wires 16 is suitably determined depending on the measurement precision and the diameter of the wire 16, but in general, a pitch of 0.02 to 6.0 mm is preferable with the same pitch, since if the pitch exceeds 6.0 mm, the measurement precision is lowered and if less than 0.02 mm, a precise deformation is hard in spite of the diameter of the wire 16.

The substrate 14 for arranging a plurality of the wires 16 should be preferably made of a heat resisting material capable of resisting an application temperature of the bonding tool and having a flat surface. If the substrate 14 is made of a heat resisting material having a high heat conductivity, i.e. heat conductivity of at least 0.5 J/cm.s.K such as molybdenum or tungsten, rising of the temperature of the substrate 14 and uneven distribution of the temperature on the substrate 14 can be prevented when the bonding tool 16 at a high temperature is pressed. This is advantageous for precisely transferring the flatness degree of the pressing surface of the bonding tool 4.

The arrangement of the wires 16 on the substrate 14 can be carried out during the measurement, or both the ends of a plurality of the wires 16, previously arranged, can be bonded and fixed to each other, followed by being placed on the substrate 14 during the measurement. Furthermore, if the substrate 14 is provided on the surface thereof with a coating layer 15 consisting of at least one of gold, silver, copper and aluminum, the wires are deformed and simultaneously bonded to the coating layer 15 by thermocompression action when the bonding tool at a high temperature is pressed, whereby the subsequent handling is rendered easy. Of course, a plurality of the arranged wires 16 could have been previously fixed to the surface of the substrate 14.

Each of the wires 16, to which the flatness degree of the end pressing surface of the bonding tool 4 at a high temperature has been transferred, as described above, was cooled to lower the temperature to room temperature (or normal temperature) and the quantity of displacement at a predetermined position in a thermoregulating chamber is measured in conventional manner using an ordinary contact type or non-contact type flatness measurement apparatus. As shown in FIG. 7, for example, the flatness degree of the end pressing surface of the bonding tool 4 at a high temperature can be precisely obtained by measuring the quantity of displacement at the predetermined position, i.e. the varied quantity normal to the substrate 14, while moving a contact needle 17 of the contact type flatness measurement apparatus a constant distance along the longitudinal direction of the wire 16 in a direction parallel with the substrate and perpendicular to the longitudinal direction to the wire 16.

The end pressing surface, consisting of a hard material, of the bonding tool can be formed in a concave form by polishing, e.g. by lapping. The degree of flatness of the end pressing surface can be determined by measuring interference fringes by a laser interference method, or by pressing the end pressing surface of the bonding tool heated at an application temperature against a plurality of soft metal wires such as gold wires pasted on a substrate and measuring the height of the pressed and crushed soft metal wires. Even when the temperature at measurement of the flatness degree or at polishing is different from the application temperature when mounting, the flatness degree of the end pressing surface at the application temperature during mounting can substantially correctly be controlled based on the coefficient of thermal expansion of the shank material or hard material of the bonding tool.

Furthermore, it is found that for the purpose of ensuring a good degree of flatness at an application temperature selected from 200° to 650° C., it is very effective to effect polishing at the application temperature.

That is, the present invention provides a process for the production of a bonding tool comprising carrying out polishing or grinding of the end surface of a bonding tool at a temperature range of +50° C. to −100° C. from an application temperature of the bonding tool of 200° to 650° C.

As the material for forming the above described tool end part, there can preferably be used one of a plurality of surface-coated articles each comprising a substrate coated with polycrystalline diamond deposited by a gaseous phase method, the substrate consisting of a sintered compact conatining Si, $Si_3N_4$, SiC, AlN as a predominant component and/or composites thereof, diamond single crystal, cBN sintered compacts and diamond polycrystalline bodies.

As the material for forming the above described shank, there can preferably be used at least one member selected from the group consisting of Kovar, Inconel, Invar alloys, stainless steels, molybdenum, tungsten, tungsten-nickel alloys and cemented carbides.

Ordinarily, warping of an end surface of a bonding tool is caused by a thermal stress due to a difference in the thermal expansion coefficients of the tool end part and shank materials. Accordingly, however more improved the flatness degree of the end surface may be in polishing working at normal temperature, heating of the bonding tool at an application temperature of 200° to 650° C. results in a warping of the tool end surface through a difference in thermal expansion coefficients. In order to ensure a good degree of flatness at the application temperature, therefore, there are proposed a method comprising heating a bonding tool to the application temperature, subjecting it to polishing or grinding under a state in which warping is allowed to occur and ensuring the degree of flatness at the specified temperature, and a method comprising inserting a stress-moderating layer, etc. in the joint part of the tool end part and shank to reduce the thermal stress due to a difference in thermal expansions and preventing occurrence of warping due to heating up to the application temperature. The present invention aims to insure the degree of flatness at the application temperature by the former method comprising carrying out polishing during heating at the application temperature.

The production process of the present invention will be illustrated with reference to FIG. 5. In FIG. 5, the assembly comprises a tool end part 5 of a bonding tool, shank 7, polishing disk 11, heater 12 for heating the bonding tool and thermocouple 13 for controlling the temperature. For working, the tool end part 5 of the bonding tool is heated to a temperature previously determined by the heater 12 and maintained for about 1 hour up to a stationary state while constantly measuring the temperature by means of the thermocouple 5. Thereafter, the tool end surface is pressed against the polishing disk at a surface pressure of 0.001 to 1 $kg/mm^2$ and polished to ensure the degree of flatness at such temperature. Herein, the heating of the bonding tool can be carried out by the use of either an infrared heater or a resistance heating system. Of course, the bonding tool is not directly heated, but heating of the polishing disk or whole working system can be carried out and other suitable heating means can be employed if the bonding tool only reaches a predetermined temperature.

In a preferred embodiment of the present invention, a low thermal expansion metal such as Kovar or molybdenum is used as a shank material, and a soft gold-type brazing material is used as a brazing material for bonding the tool end part 5 and shank 7, so that the difference in thermal expansion coefficient between the tool end part 5 and shank 7 is relatively small. When the end surface has a dimension of at most 20 mm and a long side to short side ratio of at most 2:1, the polishing can be carried out at a temperature of +50° C. or −100° C. from the predetermined application temperature to obtain a useful flatness degree of at most 1 μm. That is, when the polishing temperature is higher by 50° C. than the application temperature, warping in a convex direction due to temperature difference between the polishing temperature and application temperature is added in addition to a convex form due to a disorder in corner in the range of 0.3 to 0.8 μm during polishing, and when being practically used, the end pressing surface becomes convex with a flatness degree exceeding 1 μm corresponding to a flatness required as a practical level.

When the polishing temperature is lower by at least 100° C. than the application temperature, warping in a concave direction due to temperature difference between the polishing temperature and application temperature is added to a convex form due to a disorder in corner in the range of 0.3 to 0.8 μm, and when being practically used, the end pressing surface becomes concave with a flatness degree exceeding 1 μm corresponding to a flatness required as a practical level. Accordingly, the polishing working is preferably carried out at the predetermined temperature and the required flatness degree of the tool end surface can be obtained even at a temperature range of +50° C. to −100° C. from an application temperature of the bonding tool of 200° to 650° C.

However, in a case where a corrosion resistance alloy such as a stainless steel is required for a material of the shank 7, an Ag-type brazing agent is used as a brazing agent, and the end surface has a long side dimension of 25 mm and long side to short side ratio of 10:1 such that warping tends to occur, it is necessary to carry out the polishing at a temrature in the range of +50° to −100° C. from the predetermined application temperature so as to obtain a practical degree of flatness of at most 1 μm.

On the other hand, in a case where a heat resistance alloy such as Inconel is used for a material of the shank 7, a soft Au-type brazing agent is used as a brazing agent and the end surface has a long side dimension of 25 mm and a long side to short side ratio of 5:1 such that warping tends to occur, the polishing is carried out at a temperature in the range of +20° C. to −40° C. from the predetermined application temperature so as to obtain a practical degree of flatness of at most 1 μm.

In addition, the present invention provides a method of correctly measuring the degree of flatness of a bonding tool for TAB when heated at a practical temperature, i.e. about 200° to 650° C.

Measurement of the quantity of displacement at a predetermined position of each wire at normal temperature is carried out in a thermostatic chamber using a contact or non-contact type flatness degree measuring apparatus.

Figure 8:
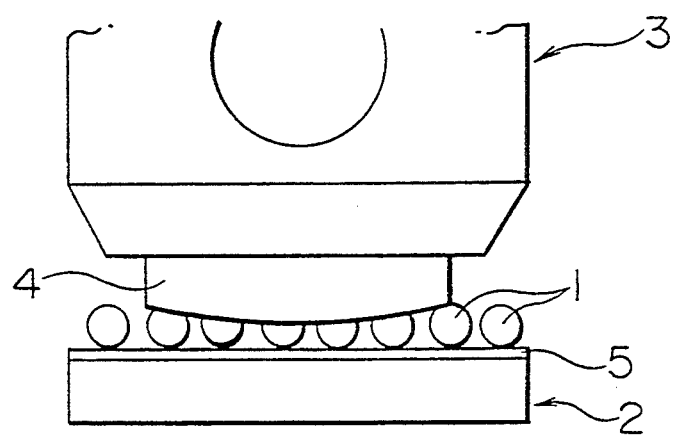
FIG. 8 is a side view schematically showing a state in which an end pressing surface of a bonding tool is pressed to a plurality of wires in a method of measuring the degree of flatness according to the present invention.
Figure 9:
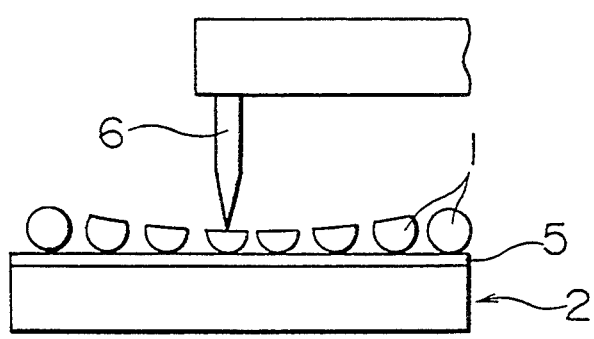
FIG. 9 is a side view schematically showing a state in which the heights of the deformed wires are determined.

One embodiment of the measurement method of the present invention will specifically be illustrated referring to FIG. 8. The method of the present invention comprises arranging a plurality of wires 1 of the same diameter consisting of at least one of gold, silver, copper and aluminum to be parallel with each other, preferably with a same pitch, on a flat substrate 2, pressing the end pressing surface of a bonding tool 3 for TAB, heated at an application temperature, i.e. about 200° to 650° C., on the plurality of wires in the vertical direction to the substrate (i.e. direction normal to the substrate) to deform a plurality of the wires 1 along the end pressing surface, transferring the flatness degree of the bonding tool 3 to a plurality of the wires 1 and determining the quantity of displacement in the vertical direction to the substrate (normal to the substrate) at a predetermined site of each of the wires at normal temperature.

By the flatness degree of the bonding tool for TAB is meant a flatness degree of a surface of a tool end part 4 consisting of gaseous phase synthesis diamond, single crystal diamond, diamond sintered compact, binderless polycrystalline cBN, etc. on a substrate, provided on the end of the tool to bond an electrode formed on an IC and a lead wire formed on a film, that is, an undulation or inclination of the surface.

For correct transferring of the flatness degree, the diameter of a wire used is preferably at least 0.01 μm, but a diameter of more than 5.0 mm is not economical and results in enlargement of a pitch required for deformation of the wire 1, thus lowering the measurement precision. This is not preferable. The pitch for the arrangement of the wires 1 can suitably be determined depending on the measurement precision and the diameter of the wire, but if exceeding 6.0 mm, the measurement precision is lowered, while if less than 0.02 mm, the gap between the wires is at most 0.01 mm and an interference of the wires occurs depending on the degree of deformation of the wires, so a correct deformation thereof is difficult. Ordinarily, it is preferable to arrange the wires with the same pitch in the range of 0.02 to 6.0 mm.

The substrate 2 for the arrangement of a plurality of the wires 1 should be made of a heat resisting material capable of sufficiently resisting the practical temperature of the bonding tool 3 and should have a flat surface. When the substrate 1 is made of a heat resisting material having a high heat conductivity, e.g. heat conductivity of at least 0.5 j/cm.s.K such as tungsten or molybdenum, rising of the temperature of the substrate 2 can be prevented and uneven distribution of the temperature on the substrate 2 can be prevented when the bonding tool at a high temperature is pressed against it. This provides the advantage of a correct transferring of the flatness degree of the bonding tool 3.

Arrangement of the wires 1 can be carried out by arranging them on the substrate g during measuring or by bonding and fixing both the ends of a plurality of the wires I previously arranged and then placing them on the wires 1 during measuring. Furthermore, if the surface of the substrate 2 is previously provided with a coated layer 5 consisting of at least one of gold, silver, copper and aluminum, the wires are deformed and simultaneously bonded to the coated layer 5 by thermocompression action when the bonding tool 3 at a high temperature is pressed against them. Thus, the subsequent handling is easy. Of course, a plurality of arranged wires 1 can previously be fixed to the surface of the substrate 2.

As described above, each of the wires 1, to which the flatness degree of the bonding tool 3 at a high temperature has been transferred, is cooled to normal temperature and then subjected to measurement of the quantity of displacement at the predetermined position in a thermostatic chamber in a conventional manner using an ordinary contact or non-contact type flatness degree measurement apparatus. The measurement of the flatness degree of time bonding tool 3 at a high temperature can be precisely carried out, for example, by moving a contact needle 6 of the contact-type flatness degree measurement apparatus in a direction in parallel with the substrate 2 and perpendicular to the longitudinal direction of the wire 1 and measuring the quantity of displacement at the predetermined position of the wire 1, i.e. the varied quantity in the vertical direction to the substrate 2 (normal to the substrate), a constant distance along the longitudinal direction of the wire 1.

The following examples are given in order to illustrate the present invention in detail without limiting the same.

EXAMPLE 1

A sintered polycrystalline diamond having a thickness of 3 mm and containing Si and SiC as a binder was cut to 13.3 mm (longitudinal)×13.3 mm (lateral) by laser to prepare a tool end part, which was then silver-brazed to a shank of Inconel. The resulting bonding tool was heated by a heater while measuring the temperature by a thermocouple and the end pressing surface of the tool end part was subjected to lapping while maintaining at various polishing temperatures, thus obtaining five degrees of flatness of the end pressing surface at an application temperature of 570° C., as shown in Table 1. The flatness degree of the end pressing surface at an application temperature of 570° C. of the bonding tool was measured by arranging gold wires having a diameter of 1 mm of the same pitch on a substrate of molybdenum, the surface of which had been metallized with gold with a thickness of 5 μm, pressing the end pressing surface of the bonding tool heated at the application temperature of 570° C. against them with a load of 10 kg for 0.5 second, and measuring the height of the crushed gold wire by means of a laser interferometer to determine the quantity of displacement from the original height, i.e. flatness degree of the end pressing surface.

The resulting five kinds of bonding tools were heated by a heater while measuring the temperature by a thermocouple to maintain the whole bodies of the bonding tools at 570° C. The tools were respectively subjected to gold—gold compression bonding of an electrode and lead of a semiconductor chip. Then, the bonded states of all the electrodes and leads on the semiconductor chip were examined to obtain the results shown in Table 1.

a manner that the polycrystalline diamond film became an end pressing surface. The end pressing surface of the polycrystalline diamond film was subjected to lapping while maintaining the bonding tool at various temperatures in an analogous manner to Example 1, and five flatness degrees of the end pressing surface at an application temperature of 500° C. were provided as shown in Table 2.

The resulting five kinds of bonding tools were heated in an analogous manner to Example 1 at 500° C. and were respectively subjected to gold-tin compression bonding of an electrode and lead of a semiconductor chip. Then, the bonded states of all the electrodes and leads on the semiconductor chip were examined to obtain the results shown in Table 2. Measurement of the flatness degree of the bonding tool was carried out in an analogous manner to Example 1.

TABLE 2

|  | Polishing Temp. (°C.) | Flatness Degree of End Pressing Surface (500° C.) | Bonded State | Remarks |
| --- | --- | --- | --- | --- |
| Example | | | | |
| 3 | 400 | 1 μm (concave) | ○ | substantially whole uniform bonding |
| 4 | 300 | 3 μm (concave) | ◉ | whole uniform bonding |
| Comparative Example | | | | |
| d | 650 | 4 μm (convex) | X | stripping of leads at peripheral part |
| e | 500 | 1 μm (convex) | Δ | low bonding strength at peripheral part |
| f | 20 | 7 μm (concave) | X | stripping of leads at central part |

TABLE 1

|  | Polishing Temp. (°C.) | Flatness Degree of End Pressing Surface (570° C.) | Bonded State | Remarks |
| --- | --- | --- | --- | --- |
| Example | | | | |
| 1 | 400 | 3 μm (concave) | ◉ | whole uniform bonding |
| 2 | 500 | 1 μm (concave) | ○ | substantially whole uniform bonding |
| Comparative Example | | | | |
| a | 100 | 8 μm (concave) | X | stripping of leads at central part |
| b | 250 | 6 μm (concave) | Δ | low bonding strength at centeral part |
| c | 570 | 1 μm (convex) | Δ | low bonding strength at peripheral part |

It is apparent from Table 1 that the bonding tool of Example 1 of the present invention, whose end pressing surface has a flatness degree of 1 or 3 μm at an application temperature of 570° C. gives a better bonded state between the electrode and lead as compared with the bonding tools of Comparative Examples including that of the prior art having a convex end pressing surface, used at the same application temperature.

EXAMPLE 2

A polycrystalline diamond film with a thickness of 80 μm was formed on a substrate of silicon carbide (SIC) with a thickness of 3 mm by a hot filament CVD method and then laser-cut to 13.5 mm (longitudinal) × 1.5 mm (lateral) to prepare a tool end part, which was then gold-brazed to a shank of Kovar in such

EXAMPLE 3

Binderless sintered polycrystalline cBN with a thickness of 1.5 mm was cut to 25 mm (longitudinal) × 1 mm (lateral) to prepare a tool end part, which was then gold-brazed to a shank of a tungsten alloy to prepare a bonding tool. The end pressing surface consisting of the polycrystalline cBN of the bonding tool was subjected to lapping while maintaining the bonding tool at various temperatures as shown in Table 3 in an analogous manner to Example 1 and the flatness degree of the end pressing surface at an application temperature of 650° C. was adjusted.

As to the resulting five kinds of the bonding tools, the flatness degree of the end pressing surface at a bonding tool temperature of 20° C. and an application temperature of 650° C. was measured in an analogous manner to Example 1 to obtain the results shown in Table 3. Using the resulting five kinds of the bonding tools, electrodes and leads of semiconductor chips at an application temperature of 650° C. were subjected to gold—gold thermocompression bonding and then, the bonded states of all the electrodes and leads on the semiconductor chip were examined to obtain the results shown in Table 3.

TABLE 3

| Polishing Temperature (°C.) | Flatness Degree at 20° C. | Flatness Degree at 650° C. | Bonded State |
| --- | --- | --- | --- |
| 20 | 0.9 μm (convex) | 9.6 μm (concave) | X |
| 300 | 4.6 μm (convex) | 3.9 μm (concave) | ○ |
| 400 | 6.3 μm (convex) | 2.1 μm (concave) | ○ |
| 600 | 7.7 μm (convex) | 1.1 μm (concave) | ⊚ |
| 650 | 9.2 μm (convex) | 0.4 μm (convex) | △ |

It is apparent from the results of Table 3 that a bonding tool having an excellent flatness degree at normal temperature can be obtained in the case of lapping at normal temperature (20° C.) as in the prior art, but when heating at the practical application temperature, the end pressing surface becomes so largely concave that a good bonded state cannot be obtained between the electrodes and leads in the practical bonding. On the other hand, when the flatness degree at the application temperature is in the range of 1 to 5 μm with a concave form according to the present invention, the bonded state is very good.

EXAMPLE 4

A polycrystalline diamond film with a thickness of 50 μm was formed on a substrate of silicon nitride ($Si_3N_4$) with a thickness of 3 mm by a hot filament CVD method and then laser-cut to 20 mm (longitudinal)×4 mm (lateral) to prepare a tool end part, which was then gold-brazed to a shank of molybdenum in such a manner that the polycrystalline diamond film became an end pressing surface. The end pressing surface of the polycrystalline diamond film was subjected to lapping while mainatining the bonding tool at 650° C. in an analogous manner to Example 1 and a bonding tool having a long and narrow end pressing surface whose application temperature was adjusted to 550° C. was prepared.

Gold wires each having a diameter of 1 mm were then arranged on a substrate of molybdenum with the same pitch of 1 mm, the surface of which had been metallized with gold with a thickness of 5 μm, and the end pressing surface of the bonding tool heated at the application temperature of 550° C. was pressed against them with a load of 10 kg for 0.5 second. When the bonding tool was released therefrom and the substrate was taken, each of the wires was thermocompression-bonded to the metallized layer. This substrate was charged in a thermostatic chamber and while moving a contact needle of a contact-type flatness degree measuring apparatus in the longitudinal direction of the wire and a direction perpendicular thereto at the center of the longitudinal direction of the wire, the height of each of the wires from the surface of the substrate as measured to determine the quantity of displacement from the original height of the wire, i.e. the flatness degree of the end pressing surface.

Figure 10:
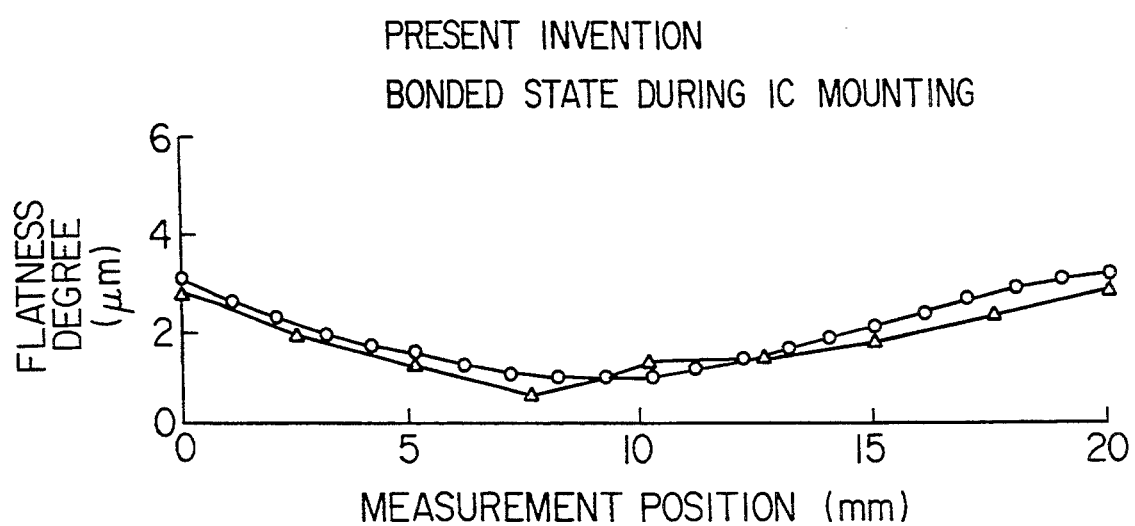
FIG. 10 is a graph showing the degree of flatness of an end pressing surface, determined respectively by a method of measuring the degree of flatness according to the present invention and from the bonded state in mounting an IC.

For comparison, or IC was subjected to practical bonding at 550° C. using the same bonding tool and the flatness degree of the end pressing surface of the bonding tool, at the same position as in the above described example, was obtained from the bonded state when mounting an IC. As can be seen from FIG. 10 showing a graph of these results, the flatness degree of the bonding tool obtained by the method of measuring the degree of flatness according to the present invention is in good agreement with the practical one.

EXAMPLE 5

Using a substrate of silicon carbide deposited with gaseous phase synthesized diamond as a material of a tool end part 5 and molybdenum as a material of a shank 7, the both were brazed with a gold type brazing material to prepare a bonding tool with an end size of 20 mm×20 mm to be used at an application temperature of 500° C., as shown in FIG. 5. The resulting bonding tool was subjected to polishing at 20° C., 150° C., 300° C., 400° C., 500° C. and 600° C. and measuring of the flatness degree at 20° C. and an application temperature of 500° C., thus obtaining results as shown in Table 4.

It is apparent from the results of Table 4 that the flatness degree at 20° C. is better in the case of polishing at a low temperature, but the flatness degree at 500° C. is better in the case of polishing in the temperature range of one preferred embodiment of the present invention.

TABLE 4

| | Polishing Temperature | | | | | |
| --- | --- | --- | --- | --- | --- | --- |
| | 20° C. | 150° C. | 300° C. | 400° C. | 500° C. | 600° C. |
| Flatness Degree at 20° C. (μm) | 0.6 (A) | 1.7 (A) | 2.6 (A) | 3.1 (A) | 3.6 (A) | 4.0 (A) |
| Flatness Degree at an application temp. of 500° C. (μm) | 3.6 (B) | 2.6 (B) | 1.3 (B) | 0.4 (B) | 0.5 (A) | 1.1 (A) |

Note: A = convex; B = concave

EXAMPLE 6

Using a sintered diamond compact as a material of a tool end part 5 and Invar alloy containing 36% of nickel as a material of a shank 7, the both were brazed with a silver type brazing material to prepare a bonding tool with an end size of 4 mm×21 mm to be used at an application temperature of 200° C., as shown in FIG. 5. The resulting bonding tool was subjected to polishing at 20° C., 180° C., 210° C., 350° C., 450° C. and 650° C. and measuring of the flatness degree at 20° C. and an application of 200° C., thus obtaining results as shown in Table 5.

It is apparent from the results of Table 5 that the flatness degree at 20° C. is better in the ease of polishing at a low temperature, but the flatness degree at 200° C. is better in the case of polishing in the temperature range of one preferred embodiment of the present invention.

TABLE 5

| | Polishing Temperature | | | | | |
| --- | --- | --- | --- | --- | --- | --- |
| | 20° C. | 180° C. | 210° C. | 350° C. | 450° C. | 650° C. |
| Flatness Degree at 20° C. (μm) | 0.5 (A) | 1.7 (A) | 2.4 (A) | 3.9 (A) | 4.7 (A) | 7.3 (A) |
| Flatness Degree at an application temp. of 200° | 1.8 (B) | 0.3 (B) | 0.4 (A) | 1.1 (A) | 1.8 (A) | 3.4 (A) |

TABLE 5-continued

| | Polishing Temperature | | | | | |
|---|---|---|---|---|---|---|
| | 20° C. | 180° C. | 210° C. | 350° C. | 450° C. | 650° C. |
| C. (μm) | | | | | | |

Note:
A = convex; B = concave

EXAMPLE 7

Using a binderless sintered polycrystalline cBN as a material of a tool end part 5 and tungsten alloy as a material of a shank 7, the both were brazed with a gold type brazing material to prepare a bonding tool with an end size of 1 mm×25 mm to be used at an application temperature of 650° C., as shown in FIG. 5. The resulting bonding tool was subjected to polishing at 20° C., 300° C., 400° C., 600° C., 650° C. and 670° C. and measuring of the flatness degree at 20° C. and an application of 650° C., thus obtaining results as shown in Table 6.

It is apparent from the results of Table 6 that the flatness degree at 20° C. is better in the case of polishing at a low temperature, but the flatness degree at 650° C. is better in the case of polishing in the temperature range of one preferred embodiment of the present invention.

TABLE 6

| | Polishing Temperature | | | | | |
|---|---|---|---|---|---|---|
| | 20° C. | 300° C. | 400° C. | 600° C. | 650° C. | 670° C. |
| Flatness Degree at 20° C. (μm) | 0.9 (A) | 4.6 (A) | 6.3 (A) | 7.7 (A) | 9.2 (A) | 9.5 (A) |
| Flatness Degree at an application temp. of 650° C. (μm) | 9.6 (B) | 3.9 (B) | 2.1 (B) | 0.7 (B) | 0.4 (A) | 0.8 (A) |

Note:
A = convex; B = concave

EXAMPLE 8

A polycrystalline diamond film with a thickness of 50 μm was formed on a substrate of silicon nitride compact with a thickness of 3 mm by a low pressure gaseous phase synthesis method was used as a tool end part and a bonding tool for TAB was thus prepared having a tool end surface dimension of 20 mm×4 mm.

Gold wires each having a diameter of 20 μm were then arranged on a substrate of a molybdenum plate of 10 mm in thickness with a same pitch of 1 mm, the surface of which had been metallized with gold with a thickness of 5 μm by sputtering and the above described bonding tool heated at 550° C. was pressed against them with a load of 10 kg for 0.5 second. When the substrate was taken, each of the wires was thermocompression-bonded to the metallized layer. This substrate was charged in a thermostatic chamber and while moving a contact needle of a contact-type flatness degree measuring apparatus in the longitudinal direction of the wire and vertical direction thereto at the center of the longitudinal direction of the wife, the height of each of the wires from the surface of the substrate was measured to determine the quantity of displacement from the original height of the wire, i.e. the flatness degree of the end pressing surface of the bonding tool.

Figure 11:
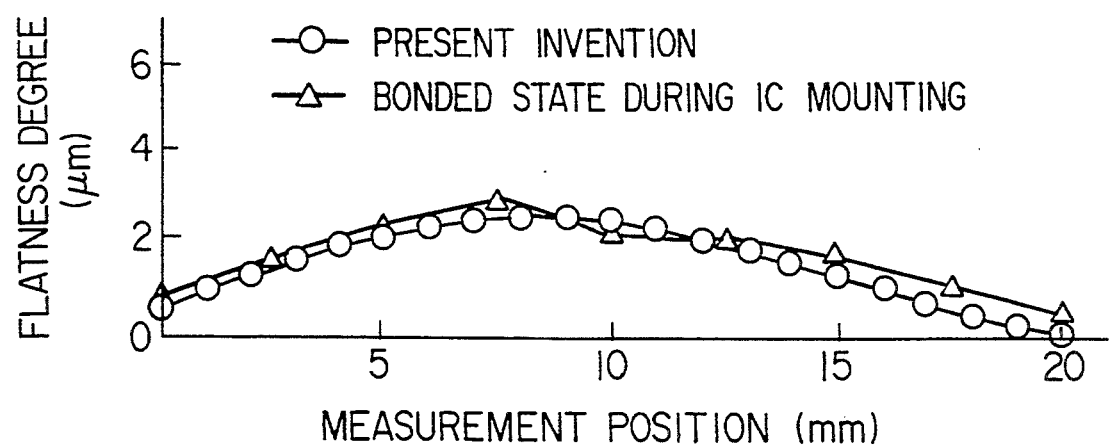
FIG. 11 is a graph showing the degree of flatness of an end pressing surface determined respectively by a method of measuring the degree of flatness according to the present invention and from the bonded state in mounting an IC in Example 8.

For comparison, an IC was subjected to practical bonding using the same bonding tool and the flatness degree of the end pressing surface of the bonding tool, at the same position as in the above described example, was obtained from the bonded state when mounting the IC. As can be seen from FIG. 11 showing a graph of these results, there was no substantial difference between them and the flatness degree of the bonding tool obtained by the method of measuring the degree of flatness according to the present ivnention which is in good agreement with the practical one.

EXAMPLE 9

Binderless sintered polycrystalline cBN with a thickness of 1.5 mm was used as a tool end part and a bonding tool was thus prepared having a tool end surface dimension of 15 mm×1 mm. Gold ires each having a diameter of 3 mm were then arranged on a substrate of a tungsten plate of 3 mm in thickness with the same pitch of 3 mm, the surface of which had been coated with gold with a thickness of 0.5 μm by electroplating and the above described bonding tool heated at 300° C. was pressed against them with a lead of 3 kg.

Each of the wires was thermocompression-bonded to the plated layer of the substrate and the flatness of the bonding tool was obtained by measuring the height of the each wire from the substrate.

Figure 12:
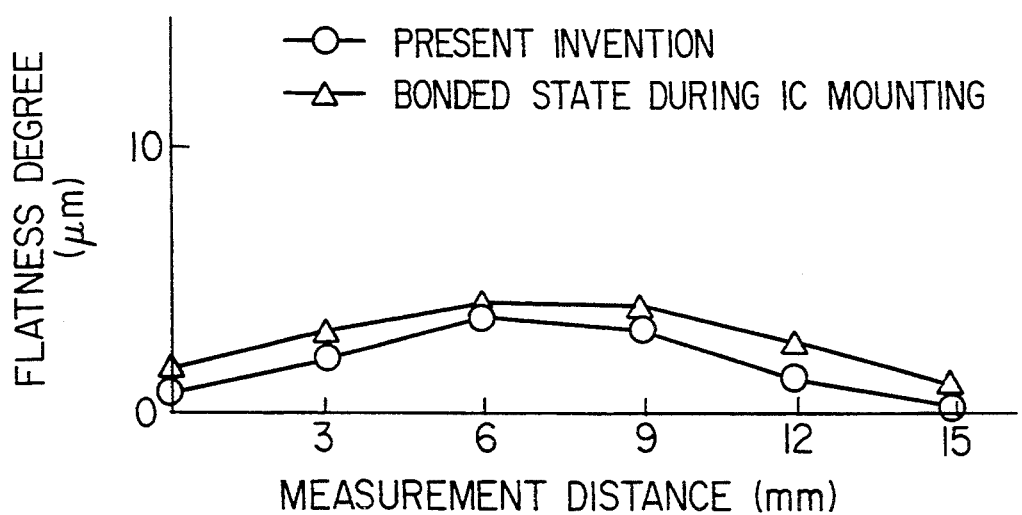
FIG. 12 is a graph showing the degree of flatness of an end pressing surface determined respectively by a method of measuring the degree of flatness according to the present invention and from the bonded state in mounting an IC in Example 9.

For comparison, IC was subjected to practical bonding using the same bonding tool and the flatness degree of the bonding tool was measured from the bonded state when mounting the IC. As can be seen from FIG. 12 showing a graph of these results, there was no substantial difference between them and the flatness degree of the bonding tool obtained by the method of measuring the degree of flatness according to the present invention which is in good agreement with the practical one.

Since an end pressing surface of a bonding tool is formed in a predetermined flatness degree at an application temperature during mounting correspondingly to warping of a semiconductor chip during practical mounting according to the present invention, all electrodes and leads of the semiconductor can uniformly and surely be pressed and practical mounting can be carried out with out poor bonding and with high reliance.

When the end pressing surface of the bonding tool is enlarged or extended with tendency of semiconductor chips to be enlarged or extended, warping of the end pressing surface or semiconductor chip during mounting is enlarged, and accordingly, it is particularly effective to apply the bonding tool of the present invention, having the end pressing surface formed in a concave form, at an application temperature during mounting, for the purpose of mounting with high reliance.

Furthermore, according to the present invention, polishing of the tool end surface is carried out at a temperature range of +50° to −100° C. from an application temperature of the bonding tool of 200° to 650° C., so the flatness degree of the tool end surface can be markedly improved. Accordingly, electrodes and leads can precisely and uniformly be pressed during mounting the IC, so that occurrence of poor bonding can surely be prevented. Consequently, the present invention can be applied, in a more effective manner, to working of a bonding tool having such a tool end surface dimension of exceeding 10 mm, for example, that a sufficient flatness degree cannot be obtained by the prior art method.

In addition, according to the present invention, the flatness degree of a bonding tool for TAB, heated at a practical temperature of about 200° to 650° C., can be precisely measured, whereas in the prior art, measurement of the flatness degree could not be carried out.

What is claimed is:

1. A bonding tool comprising:
   a shank;
   a tool end part secured to said shank and having an end pressing surface, said end pressing surface being composed of a material selected from the group consisting of polycrystalline diamond, single crystal diamond, sintered diamond compacts and cubic boron nitride; and
   wherein said end pressing surface is concave, so as to gradually curve from a peripheral portion to a central portion thereof, at an application temperature of said bonding tool, and has a degree of flatness of 1 to 5 $\mu$m at said application temperature.

2. A bonding tool as recited in claim 1, wherein said application temperature is in a range of 200° to 650° C.

3. A bonding tool as recited in claim 2, wherein said shank is formed of a material selected from the group consisting of molybdenum, tungsten, tungsten-nickel alloys, Kovar alloy, Inconel alloy, Invar alloy, stainless steels and cemented carbides.

4. A bonding tool as recited in claim 1, wherein said shank is formed of a material selected from the group consisting of molybdenum, tungsten, tungsten-nickel alloys, Kovar alloy, Inconel alloy, Invar alloy, stainless steels and cemented carbides.

5. A process for production of a bonding tool having a shank, a tool end part secured to said shank and having an end pressing surface composed of a material selected from the group consisting of polycrystalline diamond, single crystal diamond, sintered diamond compacts and cubic boron nitride, said process comprising:
   polishing or grinding said end pressing surface of said tool end part while controlling heating thereof to a predetermined temperature lower than an application temperature of said bonding tool, in such a manner that said end pressing surface becomes concave at said application temperature.

6. A process as recited in claim 5, wherein said application temperature is in a range of 200° to 650° C.

* * * * *